United States Patent [19]
Russell et al.

[11] Patent Number: 5,132,632
[45] Date of Patent: Jul. 21, 1992

[54] FREQUENCY MULTIPLIER

[75] Inventors: Mark E. Russell, Londonderry; John F. Mara, Jr., Nashua, both of N.H.; Gregory J. Pietrangelo, Haverhill, Mass.

[73] Assignee: Raytheon Company, Lexington, Mass.

[21] Appl. No.: 724,277

[22] Filed: Jul. 1, 1991

[51] Int. Cl.⁵ .......................................... H03B 19/00
[52] U.S. Cl. ........................................ 328/16; 328/20; 330/136; 330/284; 330/289
[58] Field of Search ............... 330/136, 138, 144, 145, 330/284, 289; 328/15, 16, 20

[56] References Cited
U.S. PATENT DOCUMENTS
4,101,841  7/1978  Okada et al. .................... 330/289 X Primary Examiner—James B. Mullins
Attorney, Agent, or Firm—Donald F. Mofford; Richard M. Sharkansky

[57] ABSTRACT

A frequency multiplier is shown to include either a frequency doubler or a frequency tripler coupled to an amplifier with a temperature compensation circuit and a feed forward gain control loop. With such an arrangement, a frequency multiplier is provided wherein variations of an output signal of the frequency multiplier are minimized due to changing characteristics of the frequency multiplier caused by ambient temperature variation or from a varying input signal level.

19 Claims, 7 Drawing Sheets

FREQUENCY MULTIPLIER

This invention was made with Government support under Contract DAAH01-87-C-A025 awarded by the Department of the Army. The Government has certain rights in this invention.

BACKGROUND OF THE INVENTION

This invention pertains generally to frequency multipliers and more particularly to a frequency doubler and a frequency tripler.

As is known in the art, frequency multipliers are used to derive from an input signal having an input frequency an output signal having an output frequency greater than the input frequency of the input signal. Typically, the output frequency is an exact integral multiplier of the input frequency. For example, a frequency doubler provides an output signal with a frequency that is twice the frequency of the input signal and a frequency tripler provides an output signal with a frequency that is three times the frequency of the input signal. With a combination of frequency doublers and frequency triplers, a signal with a desired frequency can be provided from a signal having a much lower frequency.

A critical characteristic of a frequency multiplier for many applications is that the frequency multiplier must provide an output signal with little phase noise added to the input signal. Phase noise is used to describe the the input signal. Phase noise is used to describe the characteristic randomness of short-term frequency fluctuations and is an important indicator of a given signal generator,s short-term frequency stability. In a signal generator application, each element of the signal generator including the frequency multiplier must have a low phase noise characteristic so that the output signal of the signal generator will have little phase noise. It is also desirable for the frequency multiplier to provide a output signal with a controlled output signal level with little variation to minimize variations introduced by a signal provided by the signal generator circuitry. Thus it is desirable to provide a frequency doubler and a frequency tripler that provides an output signal with little phase noise added to an input signal fed thereto, the output signal further having a constant signal level.

SUMMARY OF THE INVENTION

With the foregoing background in mind, it is an object of this invention to provide a frequency multiplier with an output signal having little phase noise added to an input signal fed thereto.

Another object of this invention is to provide a frequency multiplier having an output signal with a constant signal level.

Still another object of this invention is to provide a frequency multiplier that occupies a minimum amount of space while providing proper heat dissipation.

A still further object of this invention is to provide an improved frequency tripler.

In accordance with the present invention, a frequency multiplier includes means having an input and an output, for providing an output signal at the output, the output signal having a frequency of an odd multiple of a frequency of a signal fed to the input thereof and an amplifier circuit including a first amplifier having an input and an output and a gain control circuit. The gain control circuit includes a variable attenuator, having an input port, an output port and a control port and responsive to a control signal fed to the control port, for attenuating an input signal fed to the input port thereof and for providing an attenuated signal at the output thereof, the input port fed by the output of the first amplifier. The gain control circuit further includes a detector for providing an intermediate control signal in response to variations in the input signal and a temperature compensation circuit for providing a reference signal, the reference signal indicative of ambient temperature of the amplifier circuit. The gain control circuit still further includes a differential amplifier, fed by the reference signal and the intermediate control signal, for providing the control signal to the control port. The amplifier circuit further includes a second amplifier having an input and an output, the input of the second amplifier fed by the output port of the variable attenuator and the output providing the output of the frequency multiplier. With such an arrangement, a frequency multiplier is provided wherein an output signal is provided having a frequency of an odd multiple, typically a third harmonic, of the frequency of the input signal, the output signal having a constant signal level with little phase noise added to said signal by the frequency multiplier. Such a frequency multiplier is appropriate for use as an element in a low noise signal generator.

In accordance with a further aspect of the present invention, a frequency multiplier includes means having an input and an output, for providing an output signal at the output, the output signal having a frequency of an even multiple of a frequency of a signal fed to the input thereof and an amplifier circuit including a first amplifier having an input and an output and a gain control circuit. The gain control circuit includes a variable attenuator, having an input port, an output port and a control port and responsive to a control signal fed to the control port, for attenuating an input signal fed to the input port thereof and for providing an attenuated signal at the output thereof, the input port fed by the output of the first amplifier. The gain control circuit further includes a detector for providing an intermediate control signal in response to variations in the input signal and a temperature compensation circuit for providing a reference signal, the reference signal indicative of ambient temperature of the amplifier circuit. The gain control circuit still further includes a differential amplifier, fed by the reference signal and the intermediate control signal, for providing the control signal to the control port. The amplifier circuit further includes a second amplifier having an input and an output, the input of the second amplifier fed by the output port of the variable attenuator and the output providing the output of the frequency multiplier. With such an arrangement, a frequency multiplier is provided wherein an output signal is provided having a frequency of a second harmonic of the frequency of the input signal, the output signal having a constant signal level with little phase noise added to said signal by the frequency multiplier. Such a frequency multiplier is appropriate for use as an element in a low noise signal generator.

BRIEF DESCRIPTION OF THE DRAWINGS

For a more complete understanding of this invention, reference is now made to the following description of the accompanying drawings, wherein.

DESCRIPTION OF THE PREFERRED EMBODIMENTS

Figure 1:
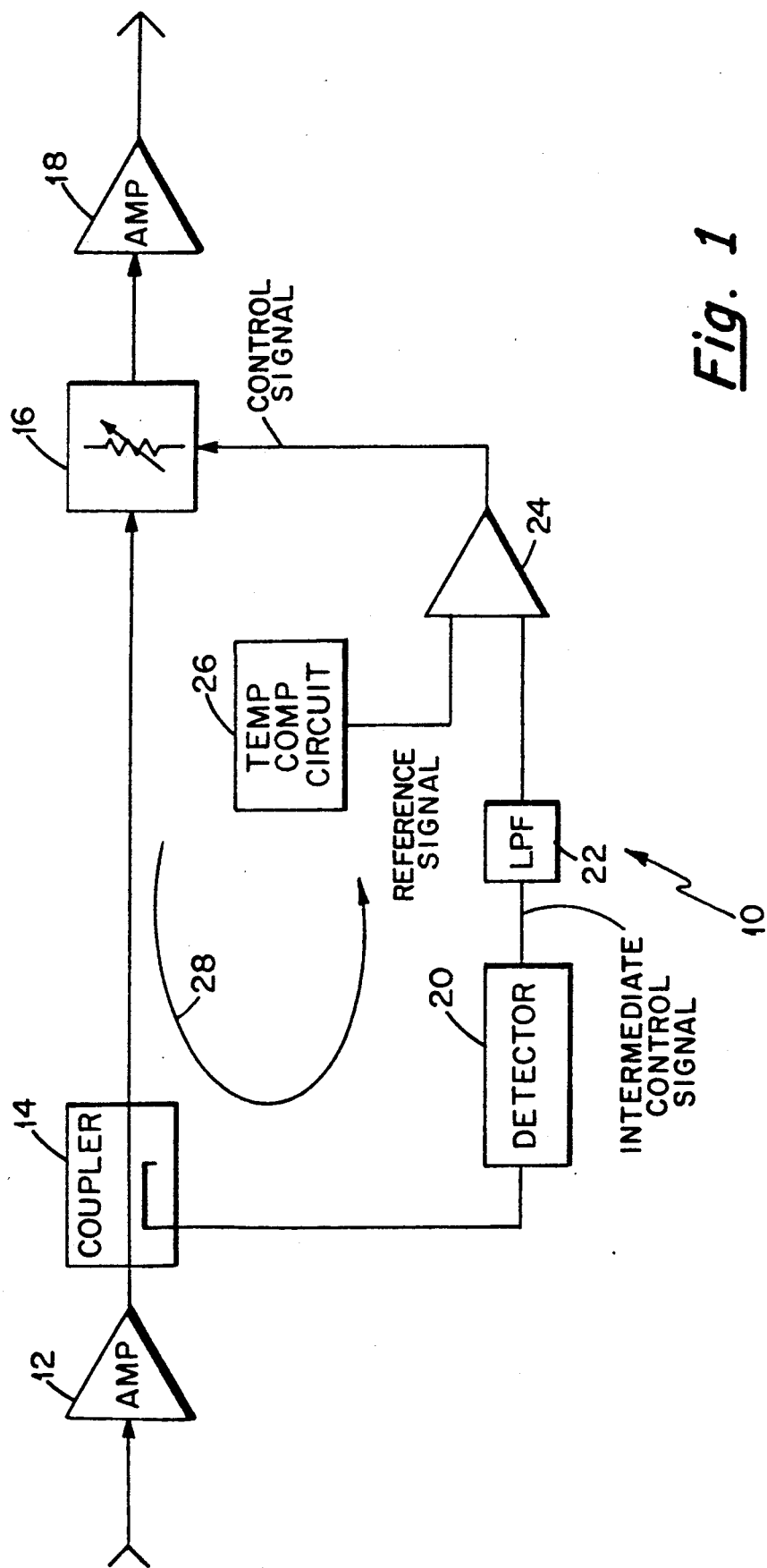
FIG. 1 is a block diagram of an amplifier circuit according to the invention.

Referring now to FIG. 1, it may be seen that a temperature compensated gain limited amplifier 10 (herein referred to as amplifier 10) here includes a first amplifier 12 having an input, which is also the input for amplifier 10, and an output. The first amplifier 12 is here capable of providing 15 dB of gain with a flat gain response and has greater than 15 dB of return loss over an octave of bandwidth, here 4.0 GHz in the frequency range from 2.0 GHz to 6.0 GHz. The output of the first amplifier 12 is connected to an input of coupler 14 having also a first and a second output. The first output of coupler 14 is connected to an input port of a variable attenuator 16. Variable attenuator 16, having also a control port and an output port is capable of providing in excess of approximately 12 dB of near linear attenuation in response to a control signal at the control port. The output port of the variable attenuator 16 is connected to an input of a second amplifier 18 having also an output which is also the output of amplifier 10. The second amplifier 18, similar to the first amplifier 12, is capable of providing 15 dB of gain with a flat gain response and has greater than 15 dB of return loss over an octave of bandwidth.

With the foregoing in mind, it may be seen that the control signal fed to the control port of the variable attenuator 16 is provided by a feed forward gain control loop 28. Thus, the second output of coupler 14 is connected to an input of a detector 20. The detector 20 is capable of providing a rectified DC voltage signal having a magnitude determined by a signal level of a signal fed to the input of the detector 20. An output of the detector 20 is connected to an input of a low pass filter 22. The low pass filter 22 having also an output allows signals having a frequency below 50 MHz pass through, while blocking signals having a frequency above 50 MHz. The output of the low pass filter 22 is connected to a first input of an operational amplifier 24 (hereinafter also referred to as a differential amplifier 24). The differential amplifier 24 also having a second input and an output is capable of providing an output signal having a magnitude as determined by a difference in magnitude between a magnitude of a first signal fed to the first input and a magnitude of a second signal provided by the detector 20. The output of the differential amplifier 24 is connected to the control port of the variable attenuator 16.

The second input of the differential amplifier 24 is connected to an output of a temperature compensation circuit 26. The temperature compensation circuit 26 is capable of providing a reference signal at the output thereof, the reference signal indicative of ambient temperature of the amplifier 10, thus having a varying magnitude determined by the ambient temperature. When the ambient temperature of the amplifier 10 is constant, the reference signal provided at the output of the temperature compensation circuit 26 has a magnitude of a predetermined value to provide an appropriate signal level at the second input of differential amplifier 24 as described further hereinafter.

With the foregoing in mind, a signal applied to the input of the amplifier 10 at the input of first amplifier 12 is amplified by the first amplifier 12 to an appropriate signal level, here typically from $-17$ dBm to $-2$ dBm. A signal at the output of the first amplifier 12 is passed through coupler 14 wherein the signal is attenuated by 0.5 dB and fed to the input port of the variable attenuator 16. The signal fed to the input of the variable attenuation 16 is provided at the output thereof and attenuated an amount as determined by the control signal applied to the control port of the variable attenuator 16. Here, the attenuation of the signal with the control signal applied is typically 5 dB. The signal at the output of the variable attenuator 16 is fed to the input of the second amplifier 18. The signal is amplified approximately 15 dB by the second amplifier 18 and provided at the output of the second amplifier 18. It should be appreciated, amplifier 10, as thus described, provides approximately 22.5 dB of gain to a signal applied to the input thereof.

The control signal for the variable attenuator 16 is provided by the gain control loop 28. A portion of the signal at the output of first amplifier 12 is coupled by the coupler 14 and provided a the second output of coupler 14. From the second output of coupler 14, the signal is fed to the input of detector 20. The detector 20 is adapted to provide a constant rectified DC voltage signal at the output thereof when the signal fed to the input of the detector 20 is non-varying in magnitude and when the input signal is varying in magnitude, the detector 20 is adapted to provide the rectified DC voltage signal changed in voltage an amount proportional to the magnitude of the change of the signal level of the input signal. The output signal of the detector 20 is passed through a low pass filter 22 wherein higher frequency signals are rejected. The output signal of the detector 20 provides an intermediate control signal to the differential amplifier 24.

It should be appreciated that the intermediate control signal will have a voltage of a predetermined value when the signal at the input of the variable attenuator 16 is non-varying in magnitude. When the magnitude of the signal level at the input of the variable attenuator 16 increases, the value of the voltage of the intermediate control signal will increase proportionally and when the magnitude of the signal level at the input of the variable attenuator 16 decreases, the value of the voltage of the intermediate control signal will decrease accordingly. Thus, the change of the value of the voltage of the intermediate control signal is representative of the change of the value of the signal level at the input of the variable attenuator 16.

With the foregoing in mind, if the intermediate control signal is provided by the detector 20 and a reference signal is fed to the second input of the differential amplifier 24, then the control signal provided at the output of the operational amplifier 24 will change in accordance with the change of the intermediate control signal which, in turn, will change the amount of attenuation provided by the variable attenuator 16. It should now be apparent, if an input signal fed to the input of amplifier 10 has an increasing signal level, then the gain control loop 28 will provide a control signal to variable attenuator 16 to cause variable attenuator 16 to provide more attenuation. Alternatively, if the input signal fed to the input of amplifier 10 has a decreasing signal level, then the gain control loop 28 will provide a control signal to the variable attenuator 16 to cause the variable attenuator 16 to provide less attenuation. Thus, the output signal provided at the output of amplifier 10 has an approximately constant signal level.

As stated hereinbefore, a reference signal is provided at the second input of the differential amplifier 24 and is here provided by temperature compensation circuit 26. At an ambient temperature of a predetermined value, the reference signal is set with an appropriate voltage so that when differenced with the intermediate control signal when a non-varying signal is provided at the input of the variable attenuator 16, an appropriate control signal is provided at the output of the differential amplifier 24. The control signal is fed to the control port of the variable attenuator 16 so that the variable attenuator 16 provides a predetermined amount of attenuation. If the ambient temperature should change, then the voltage level of the reference signal will change accordingly, which will change the control signal and the amount of attenuation provided by the variable attenuator 16. With such an arrangement, the amount of attenuation can be matched to correlate with corresponding amount of change of gain provided by the first and the second amplifiers 12, 18 due to the change in operating characteristics of the first and second amplifiers 12, 18 caused by temperature variation. By appropriately correlating the change of attenuation by the variable attenuator 16 to match the change of gain provided by first amplifier 12 and second amplifier 18, the amplifier 10 is adapted to provide a constant output signal level, although experiencing variation of ambient temperature. Thus, the amplifier 10 provides an output signal wherein variations of the output signal level are minimized due to changing characteristics of the amplifier 10 caused by ambient temperature variation or varying signal level of the input signal to the amplifier 10.

Figure 2:
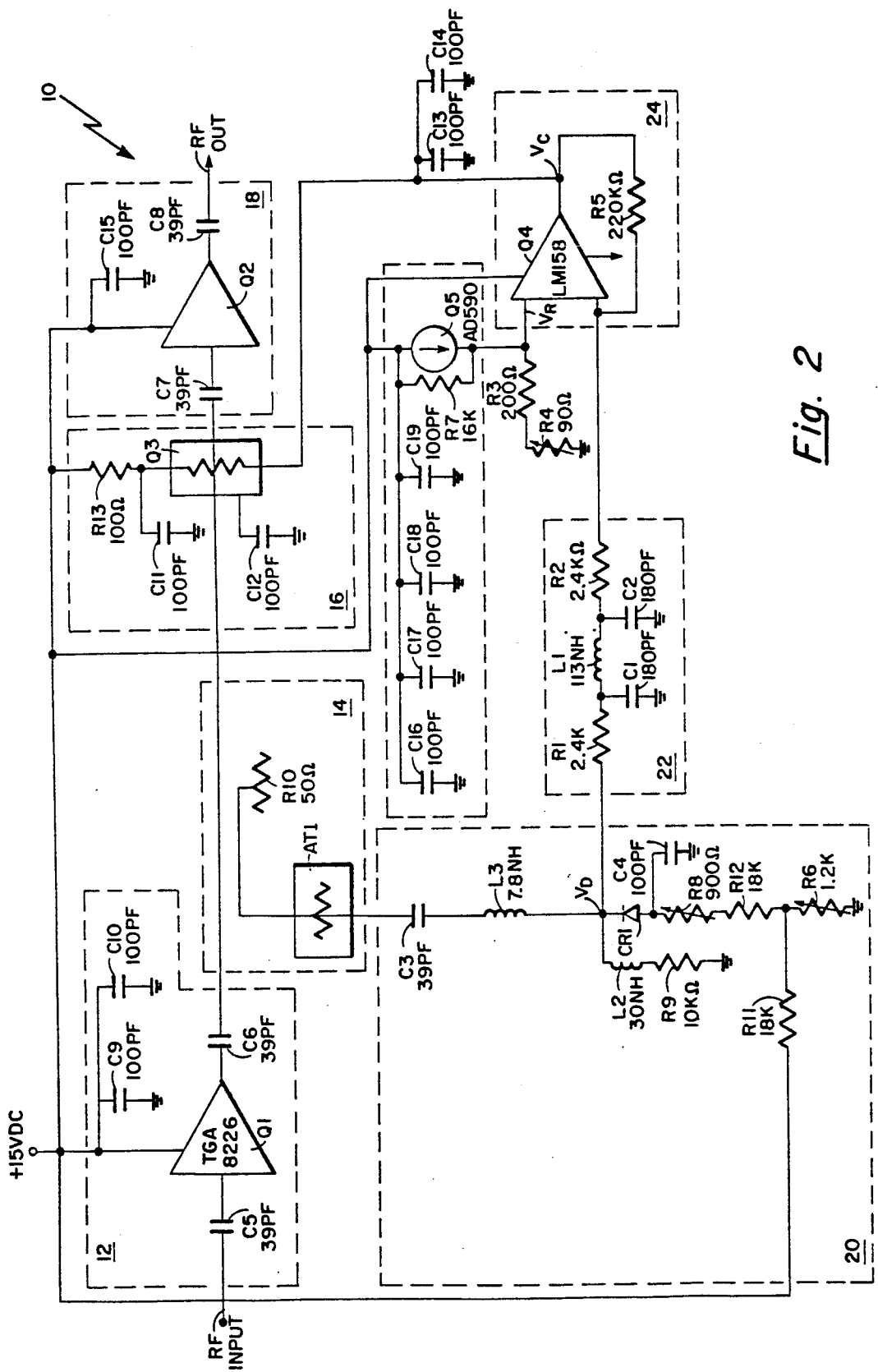
FIG. 2 is a schematic diagram of an amplifier circuit according to the invention.
Figure 3:
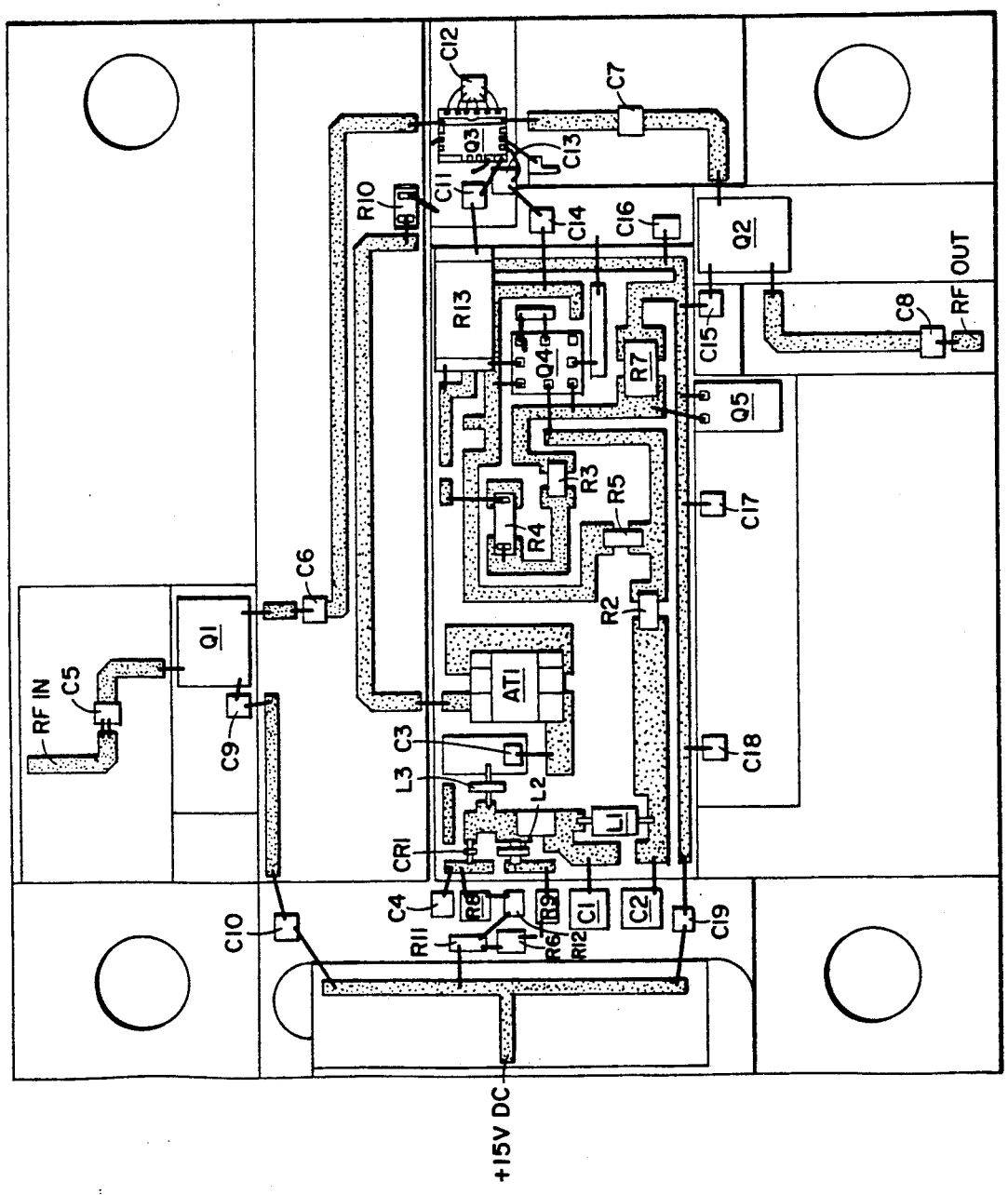
FIG. 3 is a plan view of a hybrid implementation of an amplifier according to the invention.

Referring now to FIGS. 2 and 3, the amplifier 10 as described in connection with FIG. 1 is shown implemented as a hybrid circuit. It should be appreciated wherein the amplifier 10 is implemented as a hybrid circuit, microstrip circuitry with strip conductors are disposed on a substrate (not numbered) here 0.015 inch thick alumina having 80 to 120 microns of gold disposed thereon. Since the gold will not adhere directly to the alumina, a conductive layer comprised of titanium-tungsten typically about 20 Å thick, is disposed between th gold layer and the alumina to promote adhesion of the gold to the alumina. The strip conductors are here provided using conventional photo-etching techniques. A conductive layer on an opposing surface of the substrate (not numbered) provides a ground for the hybrid circuit. It should be appreciated that capacitors Cl through C19 are parallel plate capacitors, that is two square gold metal plates with a dielectric in between. With such an arrangement, the bottom plate is bonded to the microstrip circuitry to complete one side of a connection and a bond wire is connected to the top plate to complete the other side of the connection. It should also be appreciated that although single bond wires are shown for connections on FIG. 3, for ease of clarity, multiple bond wires would be used where possible to ensure proper connection in accordance with standard bonding practices.

The amplifier 10 is adapted here to operate from a single source power supply having an output voltage of 15 volts of direct current. The input signal, here typically at a level of −17 dBm, is fed to the input of the first amplifier 12. The first amplifier 12 is here implemented with a monolithic microwave integrated circuit (MMIC) amplifier Q providing 15 dB of gain, here a TGA8226 manufactured by Texas Instruments, Inc. of Dallas, Tx. The amplifier Q is powered by the 15 volts of direct current carried on a 15 VDC power line and a 100 pF capacitor C9 and a 100 pF capacitor C10 provides an RF decoupling path to ground. The capacitors C9 and C10 are disposed such that the bottom plate is bonded to ground and bond wires are used to connect the top plate of the capacitors C9 and C10 to the 15 VDC power line. A 39 pF capacitor C5 provides DC isolation at the input of the first amplifier 12 and a 39 pF capacitor C6 provides DC isolation at the output of the first amplifier 12. The output of the first amplifier 12, which has a signal at a level of approximately −2 dBm is fed through the coupler 14 to the input of the variable attenuator 16. The signal is typically attenuated less than 0.5 dB by the coupler 14 thus having a signal level of approximately −2.5 dBm at the input of the variable attenuator 16. The variable attenuator 16 is implemented using a GaAs (gallium arsenide) MMIC attenuator $Q_3$, here a Triquint 9161 manufactured by Triquint Semiconductor, Inc. of Beaverton, Ore. providing 5 dB attenuation at +25° C. with the appropriate control signal at the control port thereof. The GaAs MMIC attenuator $Q_3$ is powered by the 15 VDC power line through a 100 Ω dropping resistor R13 which provides approximately 12 VDC to the attenuator Q3 and a 100 pF capacitor C11 provides an RF decoupling path to ground. A 100 pF capacitor C12 is also connected to attenuator Q3 to provide an RF decoupling path to ground.

The output of the variable attenuator 16 provided by the output of attenuator Q3, which has a signal level of approximately −9.5 dBm, is fed to the input of the second amplifier 18. The second amplifier is here implemented with a MMIC amplifier $Q_2$ providing 15 dB of gain and like MMIC amplifier $Q_1$ is here a TGA8226. A 39 pF capacitor C7 provides DC isolation at the input of the second amplifier 18 and a 39 pF capacitor C8 provides DC isolation at the output of the second amplifier 18. The MMIC amplifier $Q_2$ is powered by the 15 VDC power line and a 100 pF capacitor C15 provides an RF decoupling path to ground.

To provide a signal for the gain control loop 28 (FIG. 1), the coupler 14 has a main line between the first amplifier 12 and the variable attenuator 16 and a coupled line disposed to couple a portion of the signal propagating on the main line to the coupled line. A 50 ohm resistor R10 is disposed at the end of the coupled line to terminate the coupled line. The other end of the coupled line is connected to attenuator AT1 wherein the signal is attenuated approximately 3dB and fed to the input of the detector 20.

The detector 20 includes a voltage dividing network including a 2.4 KΩ variable resistor R6 set to 1.2 KΩ, a 2.4 KΩ variable resistor R8 set to 900 Ω, an 18 KΩ resistor R11 and an 18 KΩ resistor R12 connected as shown to the anode of diode CR1. A 100 pF capacitor C4 is connected between the anode of diode CR1 and ground to provide an RF decoupling path to ground. The input signal to detector 20 s fed through a 39 pF capacitor C3 and then a 7.8 nH inductor L3 and applied to the cathode of the diode CR1. Furthermore, a 30 nH inductor L2 is connected in series between the cathode of diode CR1 and a 10 KΩ resistor R9 which in turn is connected to ground. A signal path from the cathode of diode CR1 provides the output from the detector 20. It should be appreciated that variable resistor R8 and variable resistor R6 ar adjusted such that diode CR1 is biased for proper operation to provide the intermediate control signal.

The low pass filter 22 includes a 2.4 KΩ resistor R1 connected in series with a 113 nH inductor L1 which is connected to a 2.4 KΩ resistor R2 as shown. A 180 pF capacitor C1 is connected between ground and a junction between resistor R1 and inductor L1. A 180 pF capacitor C2 is connected between ground and a junction between inductor L1 and resistor R2 completing the low pass filter 22. An output line of the low pass filter 22, which is connected to the resistor R2 at a first end, is connected to one of the inputs of the operational amplifier 24. It should be appreciated that resistors R1 and R2 also determine the operational characteristic of the differential amplifier 24 as to be described.

The differential amplifier 24 is configured using an operational amplifier $Q_4$ with a 220 KΩ resistor R5 connected between the output thereof and a first input thereof, the first input also connected to the output of the low pass filter 22. The operational amplifier $Q_4$ is here a LM158 manufactured by Motorola Semiconductor Products Division, Phoenix, Ariz. The operational amplifier $Q_4$ is further connected to ground and the 15 VDC power line as appropriate. A second input of the operational amplifier $Q_4$ is fed from the temperature compensation circuit 26. It should be appreciated that resistor R5 and resistors R1 and R2 determine the gain figure of the operational amplifier 24. Letting $V_D$ equal the voltage at the output of the detector 20, $V_R$ equal the voltage at the second input of the operational amplifier $Q_4$ and $V_c$ equal the voltage at the output of the operational amplifier $Q_4$, the relationship between the voltages is described by $$V_C = V_R(G + 1) - V_D G$$

where $G = \frac{R5}{R1 + R2}$ here $\frac{220\ K\Omega}{4.8\ K\Omega}$.

The temperature compensation circuit 26 includes a temperature transducer $Q_5$, here an AD590 manufactured by Analog Devices, Inc. of Norwood, Mass. having a first terminal and a second terminal. The first terminal of the temperature transducer $Q_5$ is connected to the 15 VDC power line and the second terminal is connected to the second input of the operational amplifier $Q_4$. A 100 pf capacitor C16 and a 100 pF capacitor C17, a 100 pF capacitor C18 and a 100 pF capacitor C19 are connected between the 15 VDC power line and ground to provide an RF decoupling path to ground.

A voltage dividing network includes a 16 KΩ resistor R7, a 200 Ω resistor R3 and a 240 Ω variable resistor R4 set typically at 90 Ω is connected in series between the 15 VDC power line and ground as shown. The resistor R7 is also disposed in parallel with the temperature transducer $Q_5$ so that by adjusting variable resistor R4 when the ambient temperature of temperature transducer $Q_5$ is known, an appropriate reference voltage is applied to the second input of operational amplifier $Q_4$.

It should be appreciated, the differential amplifier 24 provides the control voltage output, $V_c$, which is dependent upon the RF signal input and the reference voltage provided by the temperature compensation circuit 26. The detector 20 provides the rectified DC voltage $V_D$ as determined by the RF input power. The operational amplifier $Q_4$ attempts to keep its two input signals at the same voltage level, $V_R$, wherein $V_R$ is set by a resistor network including the resistor R7 and R3 and the temperature transducer $Q_5$. If the voltage $V_R$ changes, the output voltage $V_C$ changes accordingly. If the rectified DC voltage $V_D$ changes, then the current flow through resistor R5 and resistors R1 and R2, is changed accordingly by the operational amplifier $Q_4$, which in turn changes the voltage $V_C$ appropriately. The low pass filter 22 filters RF energy from the detector 20 to prevent oscillation in the output of the operational amplifier $Q_4$.

The output of differential amplifier 24 is fed to the control port of the GaAs MMIC attenuator $Q_3$. A 100 pF capacitor C13 and a 100 pF capacitor C14 are connected between the control port of the GaAs MMIC attenuator $Q_3$ and ground to provide an RF decoupling signal path to ground filtering out any stray RF signals.

With such an arrangement, the MMIC amplifier $Q_1$ and the MMIC amplifier $Q_2$ can function in a linear region of operation instead of at saturation with effects from variation of the signal level of the input signal having a minimal effect on the operation of the MMIC amplifiers $Q_1$ and $Q_2$. Thus, if the signal level of the input increases, the level of the signal coupled by coupler 14 to the detector 20 increases which in turn increases the level of the signal provided by the detector 20. With an increase in the signal level provided by the detector 20, the output signal fed to the control port of the GaAs MMIC attenuator $Q_3$ will cause the GaAs MMIC attenuator $Q_3$ to increase the amount of attenuation provided by the GaAs MMIC attenuator $Q_3$, thus reducing the signal level of the signal fed to the MMIC amplifier $Q_2$. With the signal level of the input signal to the MMIC amplifier $Q_2$ reduced, the signal level of the output signal of amplifier 10 is approximately constant.

If the ambient temperature should change, then the temperature transducer $Q_5$ will change the reference voltage of the signal fed to the second input of the operational amplifier $Q_4$. With a change in the reference voltage, the signal fed to the control port of the GaAs MMIc attenuator $Q_3$ will cause the attenuation provided by the GaAs MMIC attenuator $Q_3$ to change to correspond with the change of gain provided by MMIC amplifiers $Q_1$, $Q_3$ due to the change of operational characteristics caused by the ambient temperature change. With such an arrangement, the effect of ambient temperature change on the signal level of the output signal of amplifier 10 is reduced.

Figure 4:
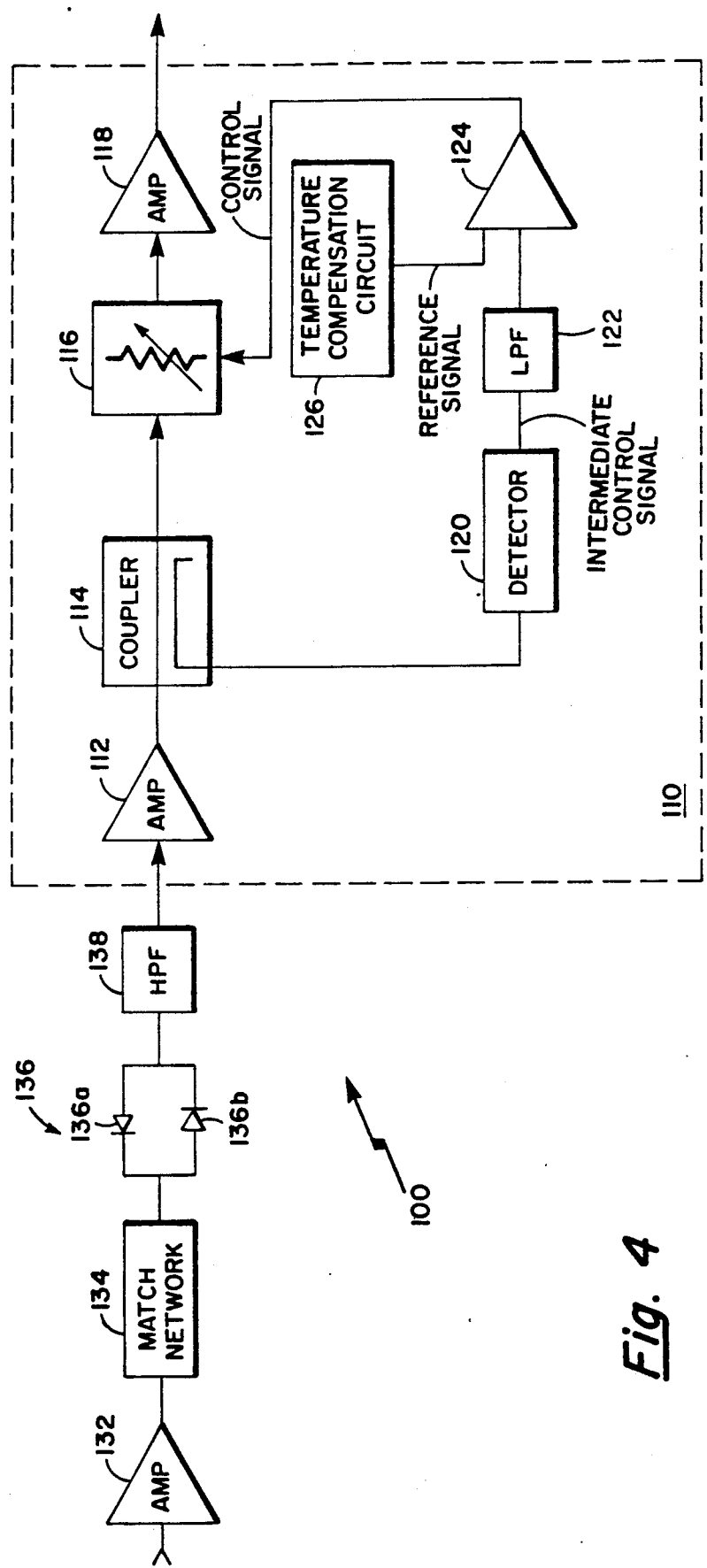
FIG. 4 is a block diagram of a frequency tripler circuit according to the invention.

Referring now to FIG. 4, a frequency multiplier 100 (here a frequency tripler) is shown to include an input amplifier 132 having an input and an output, the input also being the input of the frequency multiplier 100. The input amplifier 132 here uses a silicon MMIC amplifier having a part number HPMA-0300 and manufactured by Hewlett Packard Co., Palo Alto, Calif. The output of the input amplifier 132 is connected to an input of a matching network 134. The matching network 134 conditions a signal fed to the input thereof and provides a signal of an appropriate level at an output of the matching network 134. The output of the matching network is connected to an input of a diode pair 136. The diode pair 136, having also an output, will be described in detail hereinafter. A high pass filter 138 having an output and an input, the input connected to the output of the diode pair 136, allows a signal having a frequency within the frequency band of the high pass filter 138 fed to the input thereof to pas through to the output thereof while preventing signals below the frequency band from passing through. The output of the high pass filter 138 is connected to the input of amplifier 110. The amplifier 110 operates in a manner as described hereinbefore in connection with FIGS. 1, 2 and 3. The output of the amplifier 110 provides an output which is also an output of the frequency multiplier 100.

A signal, here from a reference oscillator (not shown), having a frequency in a range from 800 MHz to 1000 MHz is fed to the input of the input amplifier 132 wherein said signal is amplified to an appropriate level here approximately 9.3 dB and provided at the output of the input amplifier 132. The signal at the output of the input amplifier 132 is fed to the input of the matching network 134 wherein the signal is conditioned as necessary and fed to the input of the diode pair 136.

The diode pair 136 is referred to as an anti-parallel diode pair, meaning that the two diodes 136a, 136b are connected in parallel with the anode of each one connected to the cathode of the other one. If the individual diodes, here 136a and 136b, are matched or approximately identical to each other, the relative phase and amplitude of a signal created having a frequency of an even harmonic of the frequency of the input signal is such that the signal having a frequency of an even harmonic is canceled as the signal attempts to leave the diode pair 136. Signals having a frequency of an even harmonic exist in the diode pair only. Signals with a frequency of an odd harmonic of the frequency of the input signal also exist and are provided at the output of the diode pair 136. Thus, if the input signal has a frequency, $f_o$, then signals with a frequency of $f_o$, $3f_o$, $5f_o$ and etc. are provided at the output of the diode pair 136. Since it is here desired to provide a signal with a frequency, $3f_o$, by feeding the output signals provided at the output of diode pair 136 through high pass filter 138, the signal having the frequency of the input signal can be filtered away letting the signal having a frequency of the third harmonic, $3f_o$, to pass through. Thus, at the output of high pass filter 138, a signal having a frequency three times the frequency of the frequency of the input signal is provided at the output of high pass filter 138.

The signal at the output of the high pas filter 138 is fed to an input of amplifier 110. The amplifier 110 operates in a manner as described with amplifier 10 of FIGS. 1, 2 and 3. A signal fed to the input of amplifier 110 is amplified by first amplifier 112 and, after passing through coupler 114, fed to an input of a variable attenuator 116. The signal at the input of the variable attenuator 116 is attenuated accordingly, as controlled by the signal at a control port of the variable attenuator 116, and fed from the outpu of the variable attenuator 116 to an input of the second amplifier 118. The signal at the input of the second amplifier 18 is amplified and provided at the output of the second amplifier 118 which is also the output of the frequency multiplier 110. A portion of the signal fed to the input of the variable attenuator 16 is coupled by coupler 114 to detector 120 wherein a DC rectified voltage signal is developed and provided as an intermediate control signal to a differential amplifier 124. A reference signal from a temperature compensation circuit 126 is provided to a second input of the differential amplifier 124 wherein the reference signal is differenced with the intermediate control signal to provide a control signal at the output of the differential amplifier 124. The control signal is fed to the control port of the variable attenuator 116 so that the variable attenuator 116 provides a predetermined amount of attenuation. As described hereinbefore, if the ambient temperature should change, then the voltage level of the reference signal will change accordingly, which will change the control signal and the amount of attenuation provided by the variable attenuator 116. By appropriately correlating the change of attenuation by the variable attenuator 116 to match the change of gain provided by the first amplifier 112 and the second amplifier 118 due to the change in operating characteristics caused by ambient temperature variation, the amplifier 110 is adapted to provide a constant output signal level.

Figure 5:
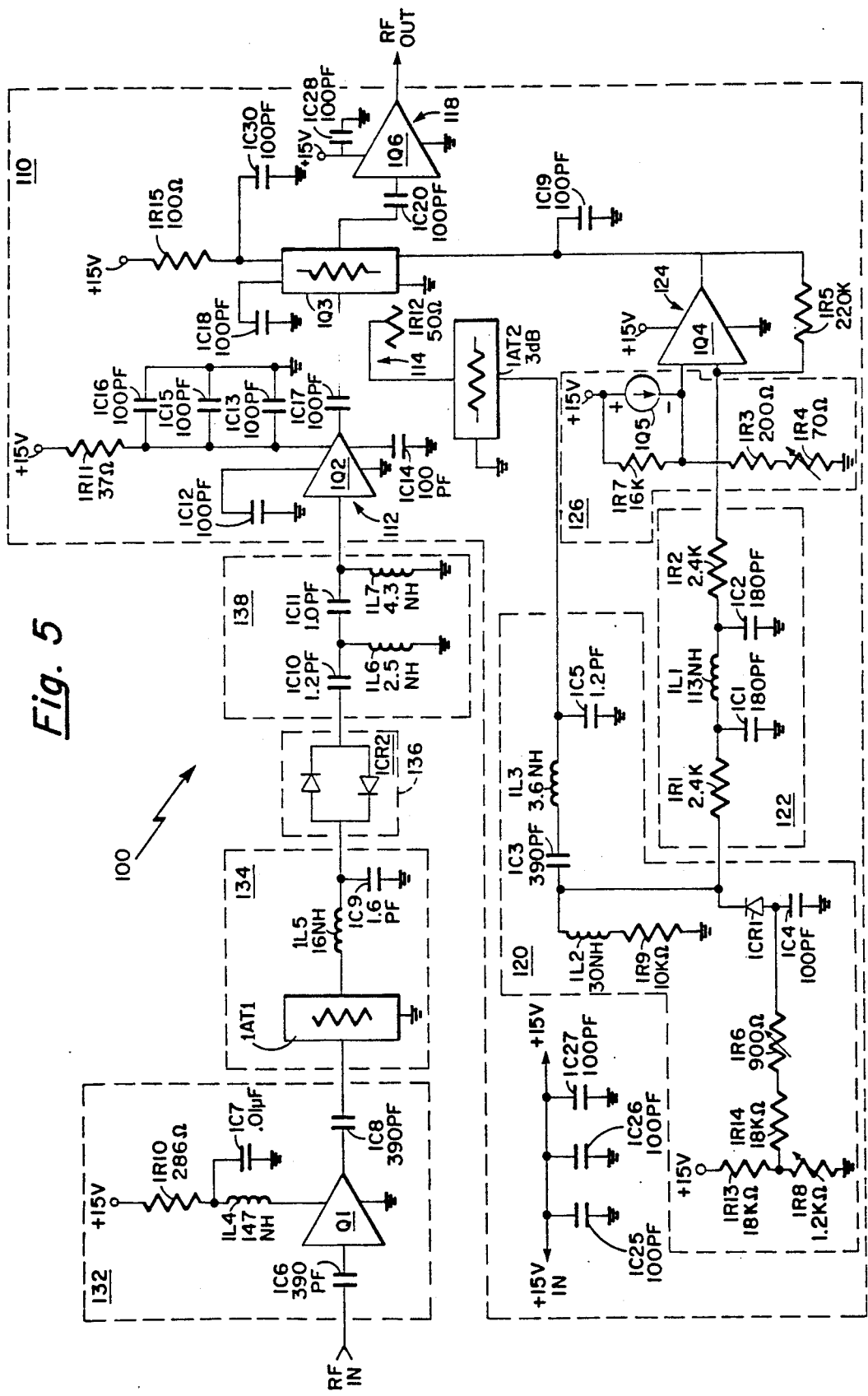
FIG. 5 is a schematic diagram of a frequency tripler circuit according to the invention.
Figure 6:
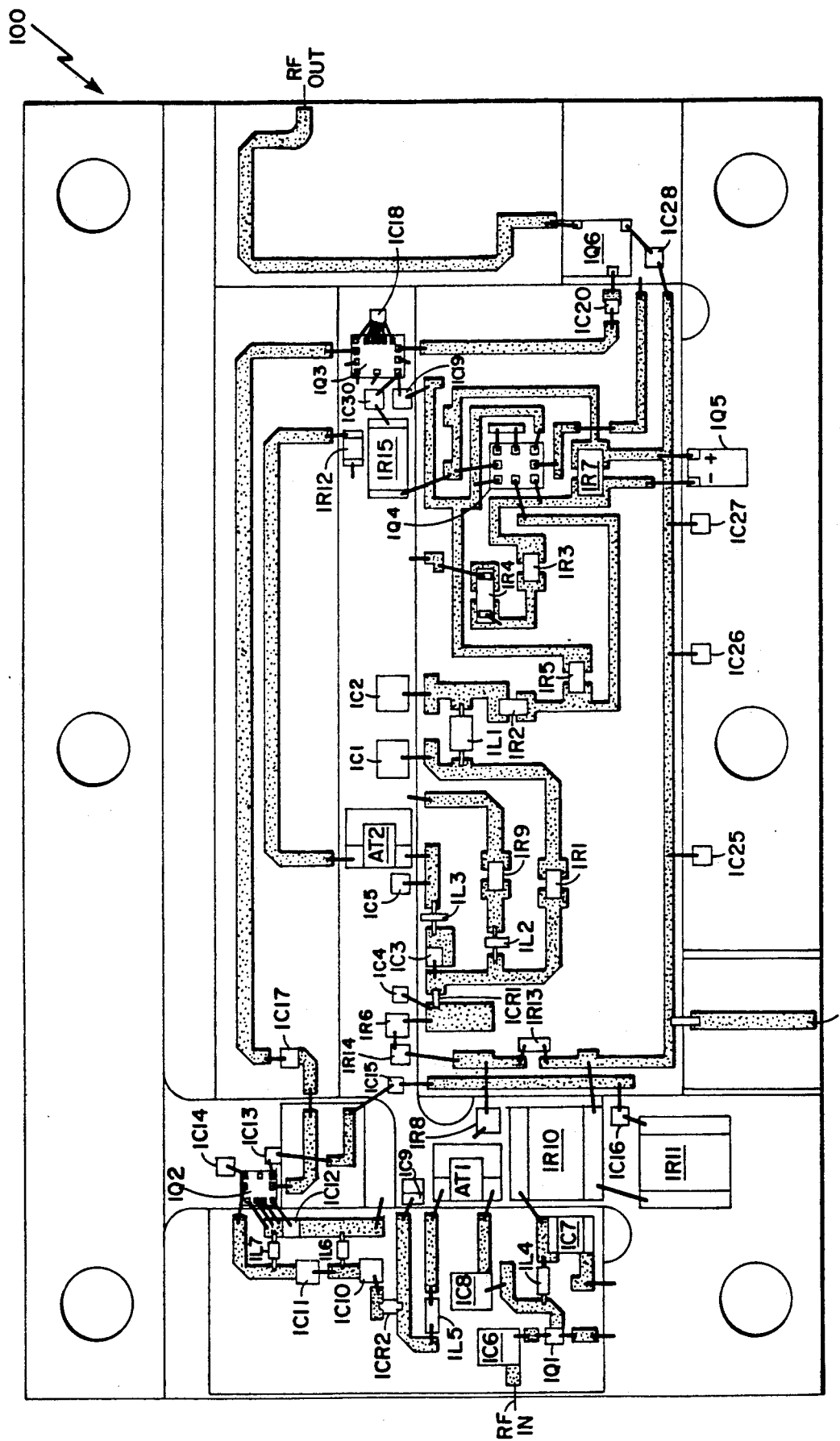
FIG. 6 is a plan view of a hybrid implementation of a frequency tripler according to the invention.

Referring now to FIGS. 5 and 6, a more detailed description of the frequency multiplier 100 as described in connection with FIG. 4 is shown as implemented as a hybrid circuit. The frequency multiplier 100 is adapted here to operate from a single source power supply having an output voltage of 15 volts direct current. A 100 pF capacitor 1C25, a 100 pF capacitor 1C26 and a 100 pF capacitor 1C27 are connected between a 15 VDC power line provided from the single source power supply and ground to provide an RF decoupling path to ground. An input signal, here from a reference oscillator, with a frequency in the frequency range from 800 MHz to 1000 MHz and a power level of −5 to −1 dBm with −3 dBm normal is fed to the input amplifier 132. A 390 pF capacitor 1C6 disposed in the input line provides isolation from the 15 VDC power line while providing connectivity for the input signal to an input of the silicon MMIC bipolar amplifier 1Q$_1$. A 286 Ω resistor 1R10, a 147 nH inductor 1L4 and a 0.01 uF capacitor 1C7 are connected with the silicon MMIC amplifier 1Q$_1$ as shown to provide the gain characteristics of the input amplifier 132. The output of the silicon MMIC amplifier 1Q is connected to the matching network 134 with a 390 pF capacitor 1C3 disposed in between providing further isolation from the 15 VDC power line between the input amplifier 132 and the matching network 134.

The matching network 134 can include an attenuator 1AT1 at the input of the matching network 134 wherein the signal fed to the input thereof can be attenuated when necessary or a jumper can be used to connect the signal path when the attenuator is omitted. A 16 nH inductor 1L5 and a 1.6 pF capacitor 1C9 are connected as shown to further condition the signal as the signal is fed to the diode pair 136.

The input signal to the diode pair 136 is tripled by the diode pair 136 as described hereinbefore and provided at the output thereof to the input of the high pass filter 138.

The high pass filter 138 includes a 1.2 pF capacitor 1C10 connected in series with a 1.0 pF capacitor 1C11 between the input and the output of the high pass filter 138. A 2.5 nH inductor 1L6 is connected between ground and a junction between the capacitor 1C10 and the capacitor 1C11. A 4.3 nH inductor 1L7 is connected between ground and the output of the high pass filter 138 completing the high pass filter 138. As described hereinabove, the high pass filter 138 provides a signal path for the signal with a frequency three times the frequency of the input signal while preventing signals below the frequency band from passing through. The signal at the output of the high pass filter 138 is fed to the input of the amplifier 110.

The amplifier 110 which operates in a manner similar to that as described with amplifier 10 of FIGS. 2 and 3 includes a monolithic microwave integrated circuit (MMIC) amplifier $1Q_2$ providing 15 dB of gain, here a TGA8161 manufactured by Texas Instruments, Inc. of Dallas, Tex. can be used as well as the TGA8226 as described ehreinafter. The amplifier $1Q_2$ is powered by the 15 volts of direct current provided on a 15 VDC power line through a 37 Ω resistor 1R11 and a 100 pF capacitor 1C16, a 100 pF capacitor 1C15, and a 100 pF capacitor 1C13 provides an RF decoupling path to ground as shown. A 100 pF capacitor 1C12 is also connected between ground and the MMIC amplifier $1Q_2$ as well as a 100 pF capacitor 1C14. The output of the MMIC amplifier $1Q_2$ is fed through a 100 pF capacitor 1C17 and the coupler 14 to the input of a GaAs (Gallium arsenide) MMIC attenuator $1Q_3$ here a Trinquint 9161 manufactured by Triquint Semiconductor, Inc. of Beaverton, Oreg. The GaAs MMIC attenuator $1Q_3$ is powered by the 15 VDC power line through an 100 Ω resistor 1R15 providing approximately 12 VDC to the attenuator 1Q3. A 100 pF capacitor 1C30 is connected between the 12 VDC power input line to the attenuator $1Q_3$ and ground to provide an RF decoupling path to ground. A 100 pF capacitor 1C18 is also connected between ground and the GaAs MMIC attenuator $1Q_3$, as shown.

The output of the GaAs MMIC attenuator $1Q_3$ is fed through a 100 pF capacitor 1C20 to an input of a MMIC amplifier $1Q_6$, here a TGA8226. The MMIC amplifier $1Q_6$ is powered by the 15 VDC power line and a 100 pF capacitor 1C28 provides an RF decoupling path to ground. The output of the MMIC amplifier $1Q_6$ provides the output of the frequency multiplier 100.

To provide a signal for the gain control loop (not numbered), the coupler 114 has a main line between the capacitor 1C17 and the GaAs MMIC attenuator $1Q_3$ and a coupled line disposed to couple a portion of the signal propagating on the main line to the coupled line. A 50 ohm resistor 1R12 is disposed a the end of the coupled line to terminate the coupled line. The other end of the coupled line is coupled to a 3 dB attenuator 1AT2 wherein the signal is attenuated approximately 3 dB and fed to the input of the detector 120.

The detector 120 includes a voltage dividing network including a 2.4 KΩ variable resistor 1R8 set to 1.2 kΩ, a 2.4 kΩ variable resistor 1R6 set to 900 Ω, an 18 kΩ resistor 1R13 and an 18 KΩ resistor 1R14 connected as shown to the anode of diode 1CR1. A 100 pF capacitor 1C4 is connected between the anode of diode 1CR1 and ground to provide an RF provide an RF decoupling path to ground. The input signal to detector 120 is fed through a 3.6 nH inductor 1L3 and a 390 pF capacitor 1C3 and applied to the cathode of the diode 1CR1. A 1.2 pF capacitor 1C5 is connected between ground and a junction between the inductor 1L3 and the attenuator 1AT2. Furthermore, a 30 nH inductor 1L2 is connected in series with a 10 KΩ resistor 1R9 between ground and the cathode of the diode 1CR1 as shown. A signal path from the cathode of diode 1CR1 provides the output from the detector 120. It should be appreciated that variable resistor 1R8 and variable resistor 1R6 are adjusted such that diode 1CR1 is biased for proper operation to provide an intermediate control signal to the low pass filter 122.

The low pass filter 122 includes a 2.4 kΩ resistor 1R1 connected in series with a 113 nH inductor 1L1 which is connected to a 2.4 KΩ resistor 1R2 as shown. A 180 pF capacitor 1C1 is connected between ground and a junction between resistor 1R1 and inductor 1L1. A 180 pF capacitor 1C2 is connected between ground and a junction between inductor 1L1 and resistor 1R2 completing the low pass filter 122. An output line of the low pass filter 122, which is connected to the resistor R2 at a first end, is also connected to one of two inputs of an operational amplifier $1Q_4$.

The operational amplifier $1Q_4$ is configured with a 220 KΩ resistor 1R5 connected between the output thereof and a first input thereof, the first input also connected to the output of the low pass filter 122. The operational amplifier $1Q_4$ is here a LM158 manufactured by Motorola Semiconductor Products Division, Phoenix, Ariz. The operational amplifier $1Q_4$ is further connected to ground and the 15 VDC power line as appropriate. A second input of the operational amplifier $1Q_4$ is fed from the temperature compensation circuit 126.

The temperature compensation circuit 126 includes a temperature transducer $1Q_5$, here an AD590 manufactured by Analog Devices, Inc. of Norwood, Mass. having a first terminal and a second terminal. The first terminal of the temperature transducer $Q_5$ is connected to the 15 VDC power line and the second terminal is connected to the second input of the operational amplifier $1Q_4$.

A voltage dividing network includes a 16 KΩ resistor 1R7, a 200 Ω resistor 1R3 and a 240 Ω variable resistor 1R4 set to 70 Ω connected in series between the 15 VDC power line and ground as shown. The resistor 1R7 is also disposed in parallel with the temperature transducer $1Q_5$ so that by adjusting the variable resistor 1R4 when the ambient temperature of temperature transducer $1Q_5$ is known, an appropriate reference voltage is applied to the second input of operational amplifier $1Q_4$.

The output of operational amplifier $1Q_4$ is fed to the control port of the GaAs MMIC attenuator $1Q_3$. A 100 pF capacitor 1C19 is connected between the control port of the GaAs MMIC attenuator $1Q_3$ and ground to provide an RF decoupling path to ground filtering out any stray RF signals.

With such an arrangement, if the signal level of the input increases, the signal level of the signal coupled by coupler 114 to the detector 120 increases which in turn increases the signal level provided by the intermediate control signal. With an increase in the signal level of the intermediate control signal the output signal fed to the control port of the GaAs MMIC attenuator $1Q_3$ will cause the GaAs MMIC attenuator $1Q_3$ to increase the amount of attenuation provided by the GaAs MMIC attenuator $1Q_3$, thus reducing the signal level of the signal fed to the MMIC amplifier $1Q_6$. With the signal level of the input signal to the MMIC amplifier $1Q_6$ reduced, the signal level of the output signal of amplifier 110 is approximately constant.

If the ambient temperature should change, then the temperature transducer $1Q_5$ will change the reference voltage of the signal fed to the second input of the operational amplifier $1Q_4$. With a change in the reference voltage, the signal fed to the control port of the GaAs MMIC attenuator $1Q_3$ will cause the attenuation provided by the GaAs MMIC attenuator $1Q_3$ to change to correspondence with the change of gain provided by MMIC amplifiers 1Q$_2$, 1Q$_6$ due to the change of operational characteristics caused by the ambient temperature change. With such an arrangement, the effect of ambient temperature change on the signal level of the output signal of amplifier 110 is reduced, thus providing a relatively constant signal level at the output of the frequency multiplier 100.

Figure 7:
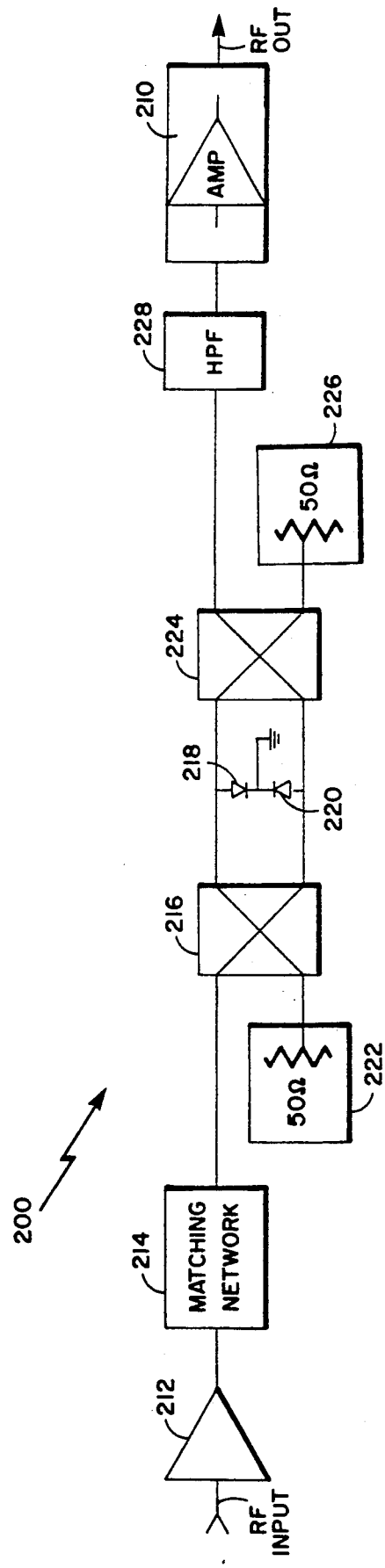
FIG. 7 is a block diagram of a frequency doubler according to the invention.

Referring now to FIG. 7, a frequency doubler 200 is shown to include an input amplifier 212 having an input and an output wherein a radio frequency signal is fed to the input thereof. The output of the input amplifier is connected to an input of a matching network 214 having also an output. A first quadrature hybrid 216 having four ports is connected such that the first port is connected to the output of the matching network 214 and the fourth port is connected to a 50 Ω resistor 222 to ground as shown. The second port and the third port of the first quadrature hybrid 216 are connected to diodes 218, 220 respectfully as shown and a to be described.

The diodes 218, 220 are Schottky diodes with the cathode of diode 218 and the cathode of diode 220 connected to ground. The anode of diode 218 is connected to the second port of the first quadrature hybrid 216 and the anode of diode 220 is connected to the third port of the first quadrature hybrid 216. A second quadrature hybrid 224 having four ports is connected such that the first port of the second quadrature hybrid 224 is connected to the anode of diode 218 and the fourth port of the second quadrature hybrid 224 is connected to the anode of diode 220. The to a 50 Ω resistor 226 to ground as shown and the second port of the second quadrature hybrid 224 is connected to a input of a high pass filter 228 having also an output. The output of the high pass filter 228 is fed to an input of an amplifier 210. The amplifier 210 having an output which is also the output of the frequency doubler 200 is a type as that described in connection with FIGS. 1, 2 and 3 having components with values appropriate for a frequency range of interest.

A radio frequency (RF) signal having a frequency, f$_o$, is fed to the input of amplifier 212 wherein the RF signal is amplified and fed to the input of the matching network 214. The signal is conditioned by the matching network 214 as appropriate and fed to the first port of the first quadrature hybrid 216. The amplifier 212 and the matching network 214 can be constructed as described with the amplifier 132 (FIG. 5) and the matching network 134 (FIG. 5), respectively.

A signal fed to the first port of the first quadrature hybrid 216 is coupled equally to the second and the third ports of the first quadrature hybrid 216 with the signal at the second port having a phase difference of 90° with the signal at the third port. The first quadrature hybrid 216 may be of any type, having four ports and functioning as the one described herein. The first quadrature hybrid 216 is a four port hybrid junction, having a first port as an input port and a second and a third port as output ports. The fourth port is terminated by the 50 Ω resistor 222. The first quadrature hybrid 216 is adapted to substantially transfer, entirely and equally, signals having a frequency, f$_o$, from the first port to the second and the third ports with the signal at the second port having a phase that leads the signal at the third port by 90°. The second port of the quadrature hybrid 216 is connected to the anode of the diode 218 and the third port of quadrature hybrid 216 is connected to the anode of the diode 220. It should be appreciated, if the signal with a fundamental frequency, f$_o$, at the anode of diode 218 has a phase difference of 90° with the signal at the anode of diode 220, then a second harmonic signal having a frequency, 2f$_o$, provided at the anode of diode 218 will have a phase difference of 180° with a second harmonic signal having a frequency, 2f$_o$, provided at the anode of diode 220. The diodes 218, 220 are connected such that the cathode of diode 218 is connected with the cathode of diode 220 to ground. With such an arrangement, if a fundamental frequency signal is fed to the anode of diode 218, the fundamental frequency signal having a phase that leads by 90° the phase of the fundamental frequency signal fed to the anode of diode 220, then the respective second harmonic signal produced in each of the diodes 218, 220 would be 180° out-of-phase with each other. The second harmonic signal at the anode of diode 218 is fed to the first port of quadrature hybrid 224 and the second harmonic signal at the anode of diode 220 is fed to the fourth port of quadrature hybrid 224.

The quadrature hybrid 224 operates similar as the quadrature hybrid 216 and is adapted to transfer signals at the fundamental frequency, fo, from the first port to the second and third ports with the signal of the fundamental frequency, fo, at the second port having a phase that leads the signal at the third port by 90°. Furthermore, the quadrature hybrid 224 is adapted to transfer signals from the fourth port to the second and third ports with the signal of the fundamental frequency, fo, at the second port having a phase that lags by 90° the phase of the signal at the third port.

It should also be appreciated wherein the phase of the fundamental frequency signal at the first port of the quadrature hybrid 224 leads the phase of the fundamental frequency signal at the fourth por of the quadrature hybrid 224, then the respective fundamental frequency signals at the second port of the quadrature hybrid 224 will be 180° out of phase with each other, thus attempting to cancel each other (commonly referred to as destructive interference). The respective fundamental frequency signals at the third port of the quadrature hybrid 224 will be in phase with each other thus enhancing the resultant signal (commonly referred to as construction interference). The resultant signal is then terminated by the 50 Ω resistor 226. It should be appreciated then at the second harmonic frequency, 2f$_o$ the second harmonic signal at the first por of the quadrature hybrid 224 is transferred equally to the second and third ports with the resultant signal at the second port having a phase that leads by 180° the resultant signal at the third port. Likewise, the second harmonic signal at the fourth port of the quadrature hybrid 224 is transferred equally to the second and third ports with the resultant signal at the second port having a phase that lags by 180° the phase of the resultant signal at the third port. It should now be apparent, since the respective signals at the first and fourth ports of quadrature hybrid 224 were 180° out-of-phase with each other, then the respective second harmonic signals when combined at the second port add with each other. Likewise, the respective second harmonic signals at the third port when combined at the third port add with each other. The signal at the third port is then terminated by the 50 Ω resistor 226.

The resultant signal having a frequency, 2f$_o$, at the second port of the quadrature hybrid 224 is fed to a high pass filter 228 which provides a signal path for the signal with a frequency two times the frequency of the input signal while preventing signals below the frequency band pass from passing through. The signal at the output of the high pass filter 228 is fed to the input of the amplifier 210. The amplifier 210 operates in a manner similar to that as described with amplifier 10 of FIGS. 1, 2 and 3. The output of the amplifier 210 provides the output of the frequency doubler 200. With such an arrangement, a frequency doubler 200 is provided which provides a relatively constant signal level at the output thereof.

Having described this invention, it will now be apparent to one of skill in the art that various elements of the signal generating circuitry may be changed without affecting this invention. Furthermore, the values of the capacitors and the inductors could be changed to accommodate the frequency range of interest. It is felt, therefore, that this invention should not be restricted to its disclosed embodiment, but rather should be limited only by the spirit and scope of the appended claims

What is claimed is:

1. A frequency multiplier comprising;
   (a) multiplying means, having an input and an output, for providing an output signal at the output, the output signal having a frequency of an odd multiple of a frequency of a signal fed to the input thereof; and
   (b) an amplifier circuit comprising:
      (i) a first amplifier having an input and an output, the input coupled to the output of the multiplier means;
      (ii) an attenuator, having an input port, an output port and a control port, the input port fed by the output of the first amplifier;
      (iii) means for providing an intermediate control signal in response to variations in an output signal fed from the outpu of the first amplifier;
      (iv) means for providing a reference signal, the reference signal indicative of ambient temperature of the amplifier circuit; and
      (v) means, fed by the reference signal and the intermediate control signal, for providing a control signal to the control port for minimizing variations of signal level in an output signal at the output port of the attenuator.

2. The frequency multiplier as recited in claim 1 wherein the multiplier means comprises a pair of diodes, each one of the pair of diodes having an anode and a cathode, with the anode of each diode connected to the cathode of the other diode.

3. The frequency multiplier as recited in claim 2 further comprising a highpass filter having an input and an outpu with the input of the highpass filter connected to the output of the multiplier means and the output of the highpass filter connected to the input of the amplifier circuit.

4. The frequency multiplier as recited in claim 3 further comprising an input amplifier having an input and an output, the output of the input amplifier coupled to the input of the multiplier means.

5. The frequency multiplier as recited in claim 4 further comprising a matching network having an input and an output, the input of the matching network connected to the output of the input amplifier and the output of the matching network connected to the input of the multiplier means.

6. The frequency multiplier as recited in claim 5 further comprising a second amplifier having an input and an output, the input of the amplifier fed by the output port of the attentuator.

7. The frequency multiplier as recited in claim 6 wherein the means for providing an intermediate control signal comprises:
   (a) a detector circuit having an input and an output and including a Schottky diode detector; and
   (b) means for coupling a portion of the input signal fed to the input port of the attenuator to the input of the detector circuit.

8. The frequency multiplier as recited in claim 7 wherein the means for providing a reference signal comprises:
   (a) a temperature transducer having a first terminal and a second terminal;
   (b) a first resistor having a first terminal and a second terminal, the first terminal of the first resistor connected to the first terminal of the temperature transducer and a voltage source and the second terminal of the first resistor connected to the second terminal of the temperature transducer; and
   (c) a second resistor having a first terminal and a second terminal, the first terminal of the second resistor connected to the second terminals of the temperature transducer and the resistor t provide the reference signal thereat and the second terminal of the second resistor connected to a voltage source return.

9. The frequency multiplier as recited in claim 8 wherein the means for providing the control signal to the control port comprises an operational amplifier.

10. A frequency multiplier comprising;
    (a) multiplying means, having an input and an output, for providing an output signal at the output, the output signal having a frequency of an even multiple of a frequency of a signal fed to the input thereof; and
    (b) an amplifier circuit comprising:
       (i) a first amplifier having an input and an output, the input coupled to the output of the multiplier means;
       (ii) an attenuator, having an input port, an output port and a control port, the input port fed by the output of the first amplifier;
       (iii) means for providing an intermediate control signal in response to variations in an output signal fed from the output of the first amplifier;
       (iv) means for providing a reference signal, the reference signal indicative of ambient temperature of the amplifier circuit; and
       (v) means, fed by the reference signal and the intermediate control signal, for providing a control signal to the control port for minimizing variations of signal level in an output signal at the output port of the attentuator.

11. The frequency multiplier as recited in claim 10 wherein the multiplier means comprises:
    (a) a first quadrature hybrid having a first port as an input port and a second and a third port as output ports, the first port being the input of the multiplier means;
    (b) a second quadrature hybrid having a first and a fourth port as input ports and a second and a third port as output ports, the first port of the second quadrature hybrid coupled to the second por of the first quadrature hybrid and the fourth port of the second quadrature hybrid coupled to the third port of the first quadrature hybrid, the second port of the second quadrature hybrid being the output of the multiplier means;

(c) a first and a second diode, each diode having an anode and a cathode, the cathode of the first diode connected to the cathode of the second diode and to ground, the anode of the first diode connected to a junction between the second por of the first quadrature hybrid and the first port of the second quadrature hybrid and the anode of the second diode connected to a junction between the third port of the first quadrature hybrid and the fourth port of the second quadrature hybrid.

12. The frequency multiplier as recited in claim 11 wherein the first quadrature hybrid comprises a fourth port, the frequency multiplier further comprising a first and a second resistor, the first resistor disposed between the fourth port of the first quadrature hybrid and ground and the second resistor disposed between the third port of the second quadrature hybrid and ground.

13. The frequency multiplier as recited in claim 12 further comprising a highpass filter having an input and an output with the input of the highpass filter connected to the output of the multiplier means and the output of the highpass filter connected to the input of the amplifier circuit.

14. The frequency multiplier as recited in claim 13 further comprising an input amplifier having an input and an output, the output of the input amplifier coupled to the input of the multiplier means.

15. The frequency multiplier as recited in claim 14 further comprising a matching network having an input and an output, the input of the matching network connected to the output of the input amplifier and the output of the matching network connected to the input of the multiplier means.

16. The frequency multiplier as recited in claim 15 further comprising a second amplifier having an input and an output, the input of the amplifier fed by the output port of the attentuator.

17. The frequency multiplier as recited in claim 16 wherein the means for providing an intermediate control signal comprises:
  (a) a detector circuit having an input and an output and including a Schottky diode detector; and
  (b) means for coupling a portion of the input signal fed to the input port of the attenuator to the input of the detector circuit.

18. The frequency multiplier as recited in claim 17 wherein the means for providing a reference signal
  (a) a temperature transducer having a first terminal and a second terminal;
  (b) a first resistor having a first terminal and a second terminal, the first terminal of the first resistor connected to the first terminal of the temperature transducer and a voltage source and the second terminal of the first resistor connected to the second terminal of the temperature transducer; and
  (c) a second resistor having a first terminal and a second terminal, the first terminal of the second resistor connected to the second terminals of the temperature transducer and the resistor to provide the reference signal thereat and the second terminal of the second resistor connected to a voltage source return.

19. The frequency multiplier as recited in claim 18 wherein the means for providing the control signal to the control port comprises an operational amplifier.

* * * * *